United States Patent [19]

Blackmer et al.

[11] Patent Number: 4,680,796
[45] Date of Patent: Jul. 14, 1987

[54] SOUND ENCODING SYSTEM

[75] Inventors: David E. Blackmer, Wilton, N.H.; James H. Townsend, Jr., Cambridge, Mass.

[73] Assignee: Kintek, Inc., Waltham, Mass.

[21] Appl. No.: 850,741

[22] Filed: Apr. 11, 1986

[51] Int. Cl.$^4$ ............................................. H04R 5/00
[52] U.S. Cl. ..................................................... 381/23
[58] Field of Search ..................... 381/16, 13, 21, 106, 381/18, 19, 20, 22, 23

[56] References Cited

U.S. PATENT DOCUMENTS

| 4,152,542 | 5/1979 | Cooper | 381/21 |
| 4,373,115 | 2/1983 | Kahn | 381/16 |
| 4,498,060 | 2/1985 | Dolby | 381/106 |

Primary Examiner—Forester W. Isen
Attorney, Agent, or Firm—Schiller, Pandiscio & Kusmer

[57] ABSTRACT

A signal encoding system for generating at least two encoded signals in response to a plurality of information signals containing audio data representative of virtual images of sources of the data so that the encoded signals can be subsequently decoded by a decoding system including a decoding matrix means for decoding the encoded signals so as to regenerate the information signals. The signal encoding system comprises signal encoding means for generating the encoded signals in response to the information signals; and a duplicate of the decoding matrix means coupled to the encoding means for generating a feedback signal corresponding to each of the information signals; wherein the encoding signals are modified in response to the feedback signals so as to reduce the noise artifacts generated by the decoding matrix when the encoded signals are decoded by the decoding system.

A system is also disclosed for modifying the signal gain impressed on an input signal so as to modify the dynamic range of at least a portion of the input signal wherein the system is of the type including operational amplification means for generating an output signal in response to the input signal and feedback means disposed in a feedback path of the operational amplification means for generating a feedback signal for the operational amplification means, wherein the feedback means includes means responsive to the output signal for impressing a gain on the feedback signal in response to and as a function of a control signal, and means for generating the control signal in response to and as a function of the output signal. The improvement comprises: the operational amplification means including means responsive to the input signal and the feedback signal for modifying the signal gain impressed on the input and feedback signals in response to a second control signal; and means for generating the second control signal in response to at least a portion of the feedback signal.

14 Claims, 7 Drawing Figures

SOUND ENCODING SYSTEM

The present invention relates generally to audio signal processing systems, and an improved noise reduction system for use in such systems and, more particularly, to systems for encoding a plurality of input signals (containing audio data relating to virtual sound images) so as to produce two encoded information signals adapted to be decoded and substantially reproduce the input signals, and an improved noise reduction system particularly adapted for use in such signal encoding systems.

As the term is used herein, "virtual image" means the apparent source of sound as psycho-acoustically perceived by the listener that is created by the combination of sonic signals generated by the loudspeakers disposed in such predisposed patterns in response to the information signals.

Systems for recording and/or broadcasting two encoded signals representative of at least four information signals representative of a corresponding number of sources of audio information are well-known. Decoder systems can be used on reception or playback to decode the two encoded information signals to substantially reproduce the original information signals. Such prior art systems include quadraphonic systems. Quadraphonic sound systems have been developed based on the fact that sufficient audio data can be encoded in the two encoded signals so that the latter can be decoded into at least four unique information signals. These information signals can in turn be used to drive at least four loudspeakers disposed in a predisposed pattern around a listener so as to create virtual images. See, for example, U.S. Pat. Nos. 3632886; 3944735; and the references cited therein, including, respectively, U.S. Pat. Nos. 2714633; 2845491; 3067287; 3067292; 3401237; and 3786193; 3794781; 3798373; 3812295; 3821471; 3856684; 3829615 and 3836715.

One common system, which has been used extensively in the movie industry, is used to encode four information signals respectively representative of audio information to be reproduced in the front, right, left and rear positions of the proposed listener. Such systems include an encoding matrix for encoding the four information signals into two encoded signals which are then recorded for the soundtrack of the film. When the audio signals are reproduced in the movie theatre, the encoded signals are applied to a decode matrix. The latter is the complement of the encode matrix so as to substantially reproduce the four information signals. The four information signals can then be applied to the appropriate loudspeakers positioned at the front, sides and rear of the movie theatre. Since the sound track offers a limited dynamic range for the recorded signals, it has been suggested that the two encoded signals each can be compressed in accordance with known techniques before recording the two signals onto a recording track. The recorded signals are then expanded in a manner complementary to the compression used in recording before they are decoded by the decoder matrix.

As described in our prior U.S. patent application Ser. No. 581,660, filed Feb. 21, 1984, now U.S. Pat. No. 4,589,129, issued May 13, 1986, an improved sound reproduction system responsive to these four information signals produced in accordance with this standard recording technique can be utilized to achieve better sound reproduction. As described in this patent, when decoding the two encoded signals with the decoding matrix so as to generate the four information signals, better control can be achieved by controlling the gain in each output channel with a signal transmitted in that channel. Further, by using a signal expander for controlling the signal gain of the information signal generated in the output channel, greater dynamic range is achieved while improving the signal-to-noise ratio of the two input signals. Even better results can be achieved where multiband expanders are used to control the signal gain of each information signal.

In accordance with another aspect of the patented invention described in our prior U.S. Pat. No. 4,589,129 the system includes more than one speaker for creating a surround signal to create greater sound effects behind a listener. Specifically, the difference between the left and right signals and the difference between the front and rear signals are used to generate steering signals to control the amount of signal to the left and right rear speakers so as to control the directionality of the virtual image.

While the system described in our prior patent provides excellent sound reproduction from signals originally encoded and decoded in accordance with the standards noted above, it has been found that while the standard technique of encoding the four signals and subsequently decoding the audio signals works extremely well for such film formats as 35 mm film, it has been found to be inadequate for such film formats as 16 mm film.

Nevertheless, there is a current trend in the motion picture industry to produce film in a 16 mm format since the prints are smaller, i.e., about 40% the length of an equivalent 35 mm print, and thus less bulky and lighter in weight. As a consequence, a feature length film can be contained on a single cassette making a single loop film strip for an entire feature length motion picture feasible, and remote control of the film print more easily obtainable. Moving the 16 mm print at 40% the speed of 35 mm, however, poses problems in reproducing sound from the soundtrack. The slower speeds makes noise much more noticeable. Impact noise, such as noise generated by dirt or scratches on the soundtrack of the print, will have a more devastating effect when reproducing sound from the slower moving 16 mm film than the corresponding situation when reproducing sound from the faster moving 35 mm film. Standard 16 mm typically has a signal-to-noise ratio (S/N) of about 35 to 40 dB. It is preferable to provide 70 to 80 dB S/N for good signal reproduction. Theoretically, a good S/N can be achieve if the encoded signals are compressed prior to recording at a 2:1 compression ratio. However, the standard process of encoding the original signals in the 35 mm film format employs the well-known Dolby A Noise Reduction System, manufactured and sold by Dolby Laboratories, Inc. of San Franciscio, Calif. This encoding system employs a multi-band compressor constructed by using a standard Dolby A decoder in the feedback loop of an operational-type amplifier. Such a construction, however, restricts the gain change in each frequency band to less than 20 dB.

If the expander employed in the feedback loop of an operational amplifier is constructed to provide a wide dynamic range output with a reasonably high expansion ratio so as to provide the gain change required to cover the full signal range of 70 to 80 dB, the gain bandwidth problem with both the expander and the operational amplifier conspire to make the feedback loop impossible to close without either oscillation due to excess phase shift at high frequencies occurring when the expander gain is high, or loss of high frequency response occurring when the expander gain is low.

More specifically, wide range linear decibel expanders are constructed with voltage or current controlled amplifiers which commonly have a 45° excess phase shift at about 1 MHz. Other components used in the feedback circuit formed by the expander and operational amplifier cause a total excess phase shift of 90° to occur near this same frequency. At high levels the expander quite often has a gain well in excess of unity. For safe operation within the constraints of the Nyquist stability criterion, the gain around the entire loop must be less than unity at any frequency where the excess phase shift due to the expander and the operational amplifier reaches 180°. The gain-bandwidth product of the operational amplifier viewed around the entire feedback loop is, therefore, constrained to be not much more than 1 MHz at maximum gain. It is common to use a single dominant pole stabilization in operational amplifiers. It then follows that the system will have a 1 KHz cutoff frequency when the relative gain of the high frequency channel of the expander is around −60 dB. This is clearly unacceptable, particularly for audio applications.

As a result, the overall signal compression ratio (over the spectral range of the signals) of the Dolby compressor is limited to about 1.3:1, which in turn limits the expansion of the decoder to the complementary expansion ratio of about 1:1.3. Consequently, employing a multi-band audio compressor in the process of encoding the audio information signal which allows exact decoding with a simple form of expander is difficult to realize when the amount of gain change is large.

Accordingly, it is a general object of the present invention to provide an improved system for processing audio signals which substantially reduces or overcomes the above-noted problems.

Another object of the present invention is to provide an improved system for encoding audio information signals so as to provide greater separation among the information signals upon reproduction.

And another object of the present invention is to provide an improved system for encoding information signals so as to substantially reduce signal artifacts which otherwise tend to occur when decoding the encoded signals on reception or playback.

Still another object of the present invention is to provide an improved signal encoding system of the type described adapted to be used in recording audio signals for 16 mm film.

Yet another object of the present invention is to provide an improved signal encoding system of the type described providing encoded signals having greater S/Ns.

And still another object of the present invention is to provide an improved signal encoding system of the type described providing greater compression ratios when encoding information signals.

These and other objects are achieved by an improved signal encoding system for generating at least two encoded signals in response to a plurality of information signals containing audio data representative of virtual images of sources of the data so that the encoded signals can be subsequently decoded by a decoding system including decoding matrix means for decoding the encoded signals so as to regenerate the information signals. The signal encoding system comprises:

signal encoding means for generating the encoded signals in response to the information signals; and a substantial duplicate of the decoding matrix means coupled to the encoding means for generating a feedback signal corresponding to each of the information signals;

wherein the encoding signals are modified in response to the feedback signals so as to reduce the noise artifacts generated by the decoding matrix when the encoded signals are decoded by the decoding system.

Another aspect of the present invention relates to an improved device for providing signal gain change in the form of signal compression at much greater overall compression ratios over the entire spectral range of the signals during the encoding process which, as will be evident hereinafter, has other applications besides its use in the signal encoding system described herein.

Accordingly, another object of the present invention is to provide an improved device for providing signal gain changes which substantially reduces or overcomes the above-noted problems.

And another object of the present invention is to provide an improved device for providing signal compression at relatively high compression ratios which can easily be reproduced using complementary expansion.

Yet another object of the present invention is to provide an improved device of the type including an expander connected in a feedback loop of an operational amplifier for providing signal compression at relatively large gain changes, without oscillation due to excess phase shift at high frequencies when the expander gain is high or loss of high frequency response when the expander gain is low.

Still another object of the present invention is to provide an improved device of the type including an expander connected in a feedback loop of an operational amplifier for providing signal compression which will not cut off the high frequency spectral portions of the information signal compressed at relatively large gain settings.

These latter and other objects are achieved by a system for modifying the signal gain impressed on an input signal so as to modify the dynamic range of at least a portion of the input signal, wherein the system is of the type including operational amplification means for generating an output signal in response to the input signal and feedback means disposed in a feedback path of the operational amplification means for generating a feedback signal for the operational amplification means, wherein the feedback means includes means responsive to the output signal for impressing a gain on the feedback signal in response to and as a function of a control signal, and means for generating the control signal in response to and as a function of the output signal. The improvement comprises:

the operational amplification means including means responsive to the input signal and the feedback signal for modifying the signal gain impressed on the input and feedback signals in response to a second control signal; and means for generating the second control signal in response to at least a portion of the feedback signal.

Other objects of the invention will in part be obvious and will in part appear hereinafter. The invention, accordingly, comprises the apparatus possessing the construction, combination of elements, and arrangement of parts which are exemplified in the following detailed disclosure, and the scope of the application of which will be indicated in the claims.

For a fuller understanding of the nature and objects of the present invention, reference should be had to the following detailed description taken in connection with the accompanying drawings wherein:

FIG. 1 is the decoding, playback system described in our U.S. Pat. No. 4,589,129.

In the drawings, the same numerals are used to designate like or similar parts.

Figure 1:
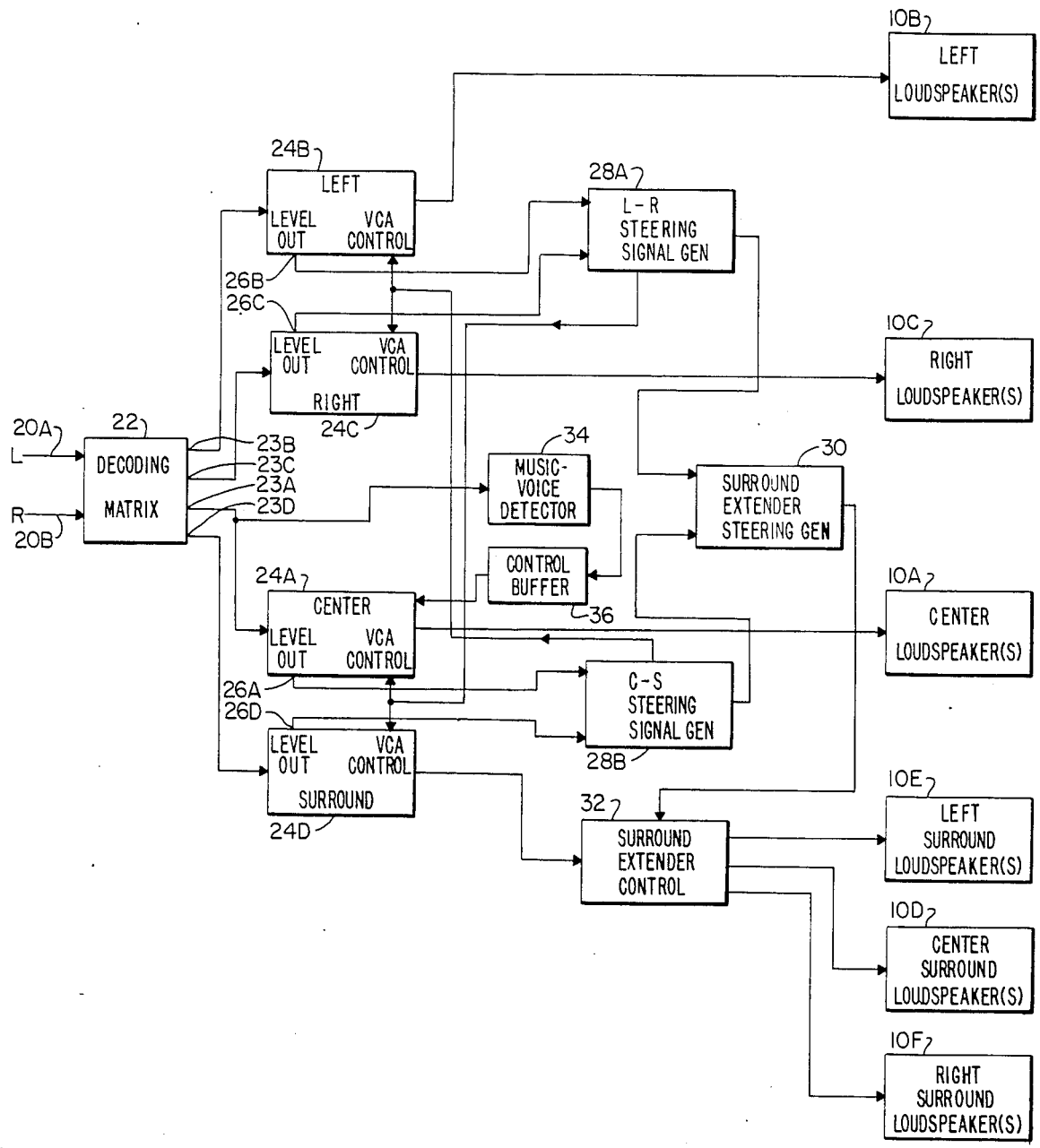

The signal decoding system shown is FIG. 1 is of the type shown in our U.S. Pat. No. 4,589,129, which is particularly adapted to be used with the loudspeaker placement shown in FIG. 2. Generally, the encoded signals are applied to the two input terminals 20A and 20B of the decoding matrix 22 shown in FIG. 1. As described in our patent, the decoding system is originally designed for use with signals encoded in accordance with the split variable area (SVA) standard used in the motion picture industry. As described in our prior patent, matrix 22 is preferably the standard matrix for generating the four information signals at the respective output terminals 23. The four decoded information signals contain the information of the location of the virtual image when reproduced on loudspeakers positioned at the four positions relative to the listener 12 depicted in FIG. 2, i.e., the front, left, right and rear positions. The decoding system shown in FIG. 1 is adapted to utilize the information in these four signals to produce additional signals for rear speakers so that different sounds can be produced from the left rear and right rear positions of the listener in addition to the center rear, when the signal information indicates such emphasis.

Figure 2:
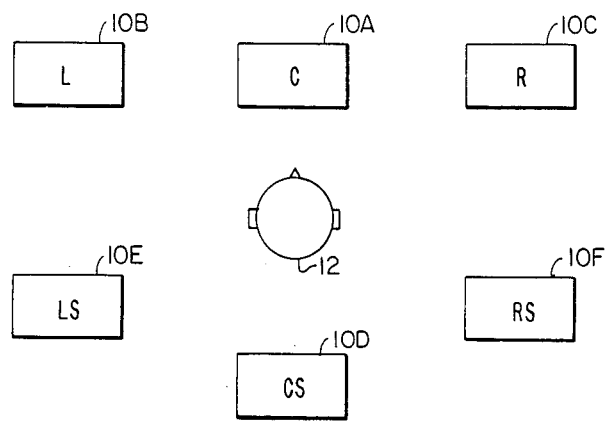
FIG. 2 shows a floor plan of a typical loudspeaker placement for playback of audio signals produced by the system of FIG. 1.

Accordingly, as shown in FIG. 2, in addition to the front speaker 10A, left speaker 10B, right speaker 10C, and center rear (surround) speaker 10D, the left and right surround speakers 10E and 10F are employed. The outputs of matrix 22 are respectively connected to the center, left, right, and surround channel signal control units 24A, 24B, 24C and 24D. Generally, each control unit 24 preferably includes a voltage control amplifier (VCA), set for expansion, and at least one level sensor adapted to sense the signal level input to that VCA and for generating a control signal to the voltage control amplifier for controlling the signal gain impressed on the respective channel information signal. The signal gain provided on each channel information signal is, thus, a function of the signal level of the channel signal and will be expanded as a function of the signal level sensed. As is well-known, expansion is a technique wherein very low level input signals are attenuated while very large signals are amplified so as to increase the dynamic range of the channnel information signal and increase the S/N of the signal.

Preferably, as shown in our U.S. Pat. No. 4,589,129, each control unit 24 is preferably a three band expander wherein each channel signal has its spectral content divided into three bands, a low band, mid-band, and high band, separately expanded and subsequently combined. The preferred expansion process employed is taught in U.S. Pat. No. 3,789,143 issued to David E. Blackmer on Jan. 29, 1974.

The outputs of units 24A, 24B, 24C are provided to the respective speakers 10A, 10B, and 10C. The output of the mid-band level sensor of each unit 24 is provided at the respective level output terminals 26. The mid-band outputs of units 24B and 24C are provided to the L-R steering signal generator 28A for comparing the mid-band levels of the left and right channel signals and for generating a signal as a function of and in response to the difference. Similarly, the mid-band outputs of units 24A and 24D are provided to the C-S steering signal generator 28B for comparing the mid-band levels of the center and surround channel signals and for generating a signal as a function of and in response to the difference. The outputs of the steering signal generators provide the inputs to the surround extender steering generator 30, which in turn provides a control signal to the surround extender control unit 32. The latter modifies the surround channel signal output from control unit 24D so as to provide directionality to and enhance virtual sound images produced by the surround loudspeakers 10D, 10E and 10F. The control unit 32 is, thus, designed to weight the signals applied to the surround speakers 10D, 10E and 10F based on the differences between the right and left information signals and between the center and surround information signals.

Finally, the center information signal, representative of the L+R information, is applied to a detector 34 preferably of the type described in U.S. Pat. No. 4,404,427 issued to David E. Blackmer, wherein a level sensor is adapted to distinguish information signals which quickly change from those that slowly change so as to distinguish between such signals as those associated with closed-miked speech, impulse noise, or staccato music which are adapted to be reproduced in a localized manner, from those associated with background music which are adapted to be reproduced by speakers connected to more than one channel. The detector 34 is connected to the control buffer 36 for reversing the polarity output of the detector 34 and applying the resulting signal to a control input terminal of the VCA of the center channel signal control signal unit 24C. As described in our prior U.S. Pat. No. 4,589,129, the detector 34 is being used for stereophonic presentation and utilizes the L+R stereo information in the center information channel to turn up (i.e., amplify) the mid-range VCA of the control signal unit 24C so as to amplify those signals indicating localization in the center channel, such as closed-mike speech. Since background information produced on multiple channels is often more reverberant than localized information, amplifying these localized signals tends to improve the intelligibility of the localized information, such as speech, and improve the balance between localized information and the background information produced on multiple channels under adverse conditions.

The system described in our prior patent and generally described with respect to FIG. 2, provides excellent sound reproduction from signals originally encoded on 35 mm film and decoded in accordance with the standards noted above. As shown generally in FIG. 3, the encoding process includes encoding the four left, center, right and surround information signals with an encoding matrix 50 which encodes the signals applied to the respective encoding input terminals 48 in a manner well known in the art. The encoded signals provided at the output terminals 52 of the matrix 50 can then be recorded in the recording channel 54. On subsequent playback the decoding matrix 22 provides the four information signals at the respective output terminals 23, which in turn apply the four signals to the FIG. 1 embodiment as described in FIG. 1.

Figure 3:
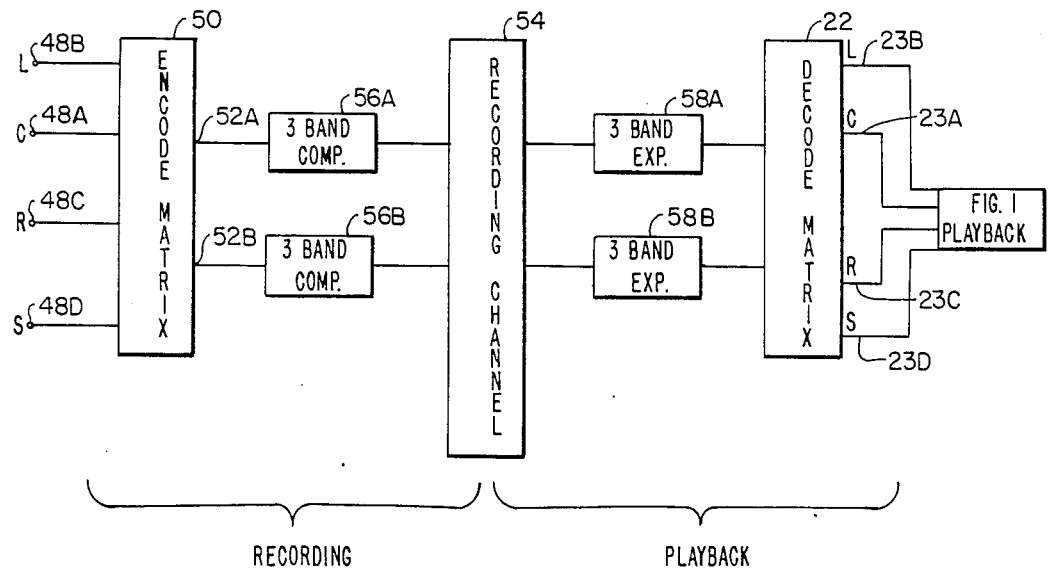
FIG. 3 is a block diagram of a prior art approach of compressing the encoding signals and complementary expanding the two encoded signals when subsequently playing back the information signals with the FIG. 1 system or other similar systems.

In accordance with techniques well-known in the art, each encoded signal can be compressed with a multi-band compressor 56 prior to recording the encoded signal in the recording channel 54 (see FIG. 3). Each compressed encoded signal is expanded in a complementary manner with expander 58, prior to decoding the encoded signals. The compression-expansion process will improve the S/N of the decoded information signals provided at the output terminals 23 and enhance the dynamic range of the information signals provided to the FIG. 1 playback system.

It has been found that while the standard technique of encoding the four signals and subsequently decoding the audio signals (whether with the FIG. 1 decoding technique or other techniques known in the art) works reasonably well for such film formats as 35 mm film, it has been found to be inadequate for such film formats as 16 mm film.

As previously described, moving the 16 mm print at 40% the speed of 35 mm poses problems in reproducing sound from the soundtrack. The slower speed results in noise from the print becoming more noticeable. Impact noise, for example, generated by dirt or scratches, will have a more devastating effect when reproducing sound from the slower moving 16 mm film. Standard 16 mm typically has a signal-to-noise ratio (S/N) of about 35 to 40 dB. It is preferable to provide 70 to 80 dB S/N for good signal reproduction. Theoretically, the latter S/N can be achieved if the encoded signals are compressed with the compressors 56 prior to recording at a 2:1 compression ratio. However, the standard compression techniques currently used in the signal encoding systems developed by Dolby Laboratories provides a limited overall compression ratio of about 1.3:1. Consequently, it was necessary prior to the present invention to limit the expansion ratio of the expanders 58 so that the expanders expand the decoded signal by a complementary expansion ratio of between about 1:1.3.

In accordance with the present invention, an improved encoding system is provided for achieving the compression ratios desired without concern about the limitations imposed by the Dolby Laboratories compressor.

Figure 4:
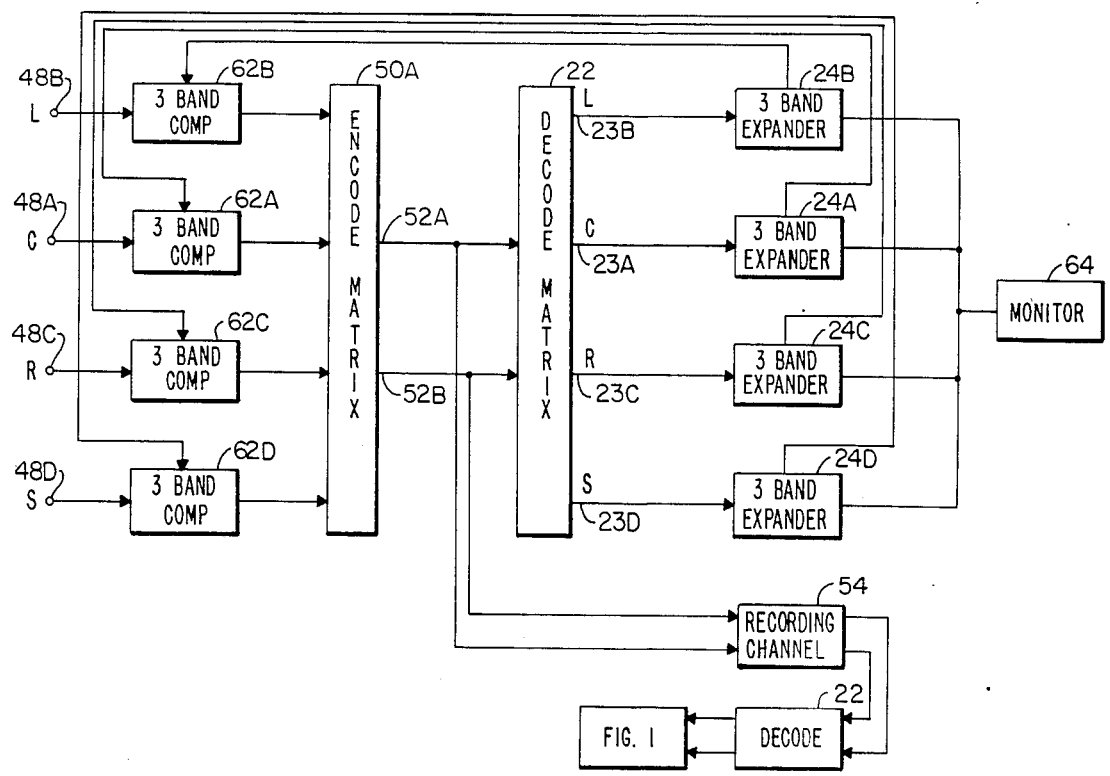
FIG. 4 is a block diagram of the preferred embodiment of the encoding system of the present invention.

More specifically, FIG. 4 shows the preferred encoder system. The latter includes means for substantially reducing the effects of artifacts generated by the decoder matrix 22. In particular, the encoder of FIG. 3 is modified to include the portions of the decoder of FIG. 1 which generate the artifacts, i.e., the decoding matrix 22.

In FIG. 4, the four information signals L, C, R and S are applied to the four respective input terminals 48 of the encoder circuit. Each input terminal 48 is applied to the input of a compressor 62, preferably of the multi-band type, with three bands being adequate. The preferred embodiment of each compressor 62 is described in greater detail with regard to FIG. 6. Each compressor 62 compresses the corresponding signal received at its input at the desired compression ratio which can be chosen to be the same for all the compressors 62, or they can vary to provide weighting among the different channels so as to enhance the channel separation between the various channels and define a more pronounced virtual image. In the preferred embodiment, the left and right channels are compressed by the same compression ratio of 1.3:1, while the center signal is compressed less, at a ratio of 1.2:1, and the surround signal is compressed more, at a ratio of 1.5:1. The output of the encode matrix 50A is the encoded signals representative of the total left and total right stereophonic information $L_T$ and $R_T$. The matrix 50A preferably is modified from the prior art matrix shown in FIG. 3 in a manner described in greater detail in FIG. 7. The output of the encode matrix 50A is applied to the input of the decode matrix 22, identical to the decode matrix used in the FIG. 1 embodiment. The four outputs of the decode matrix are preferably respectively connected to the four inputs of control units 24, also identical to those used in FIG. 1.

Figure 5:
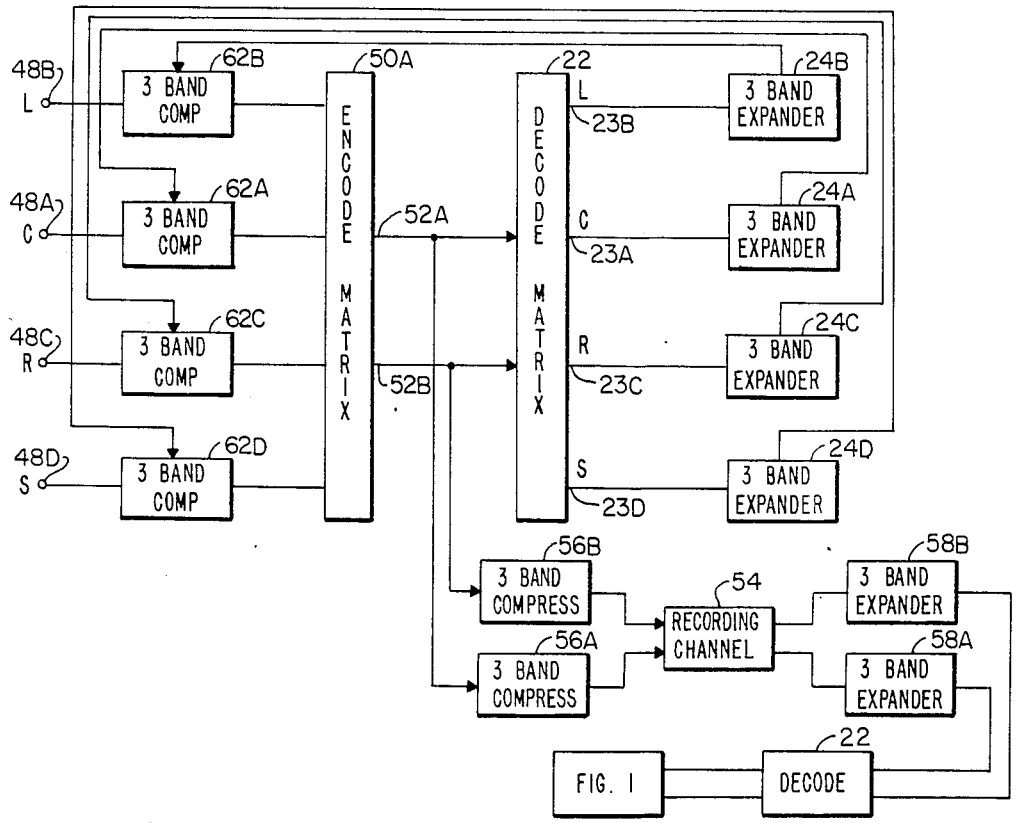
FIG. 5 is a block diagram of the embodiment shown in FIG. 4 modified in accordance with one aspect of the present invention so as to provide greater signal compression.
Figure 6:
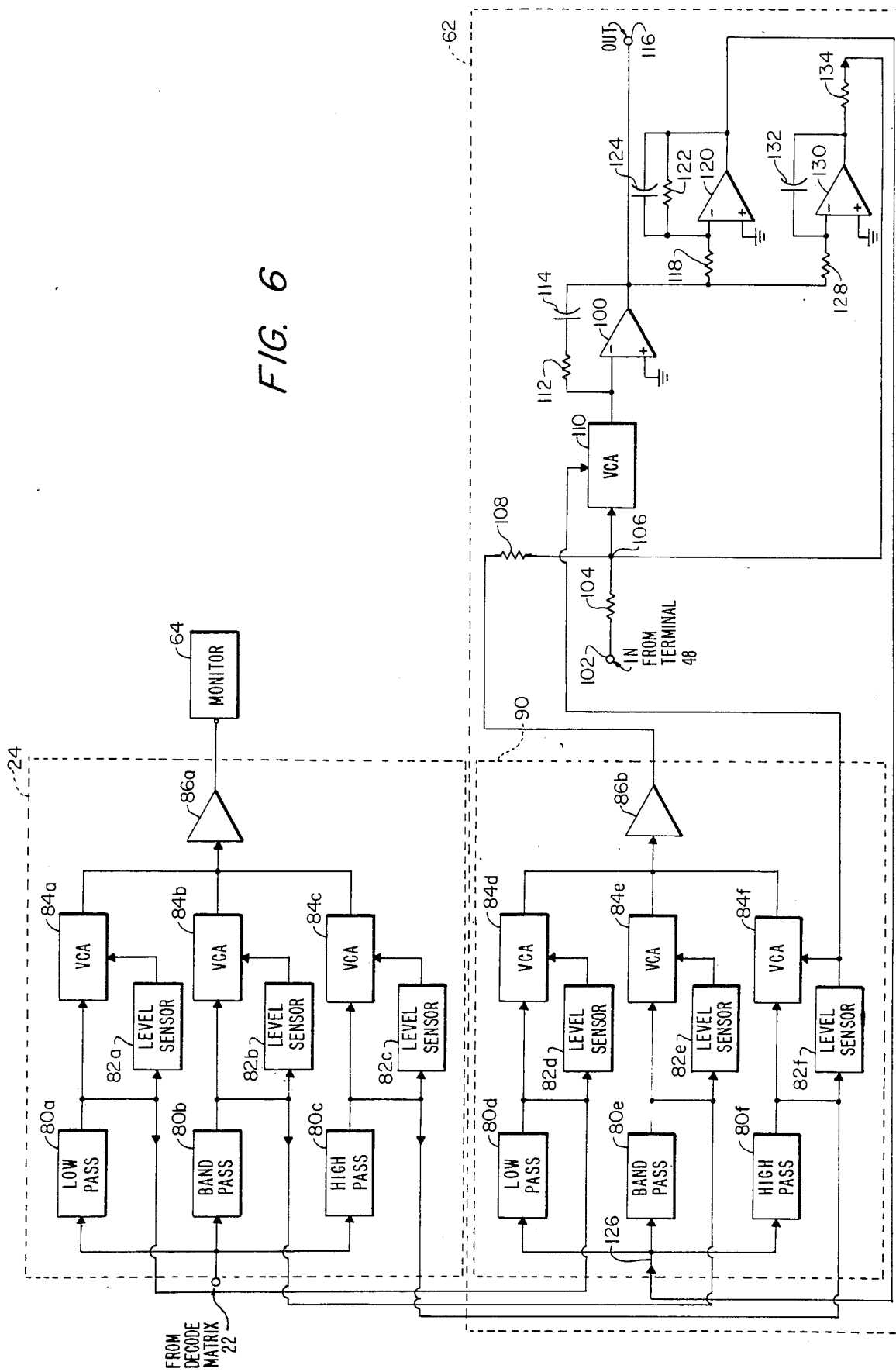
FIG. 6 is a more detailed diagram, partially in block form and partially in schematic form, showing the details of the compressor made in accordance with the present invention and utilized in the FIGS. 4 and 5 embodiments.

The outputs of the lowpass, mid-band and highpass filters of each of the expanders 24A, 24B, 24C and 24D are connected to the inputs of the level sensors of the lowpass, mid-band and highpass bands of the corresponding compressors 62A, 62B, 62C and 62D, as described in greater detail in FIG. 6. The output of the expanders can be connected to a monitor 64 for monitoring the recording process. In this regard, the expanders 24 provide the complement to compressors 62 by providing the various weighting factors to the expansion of each of the signals which are opposite to those provided by the compressors. Thus, preferably the left and right information signals are expanded by an expansion ratio of 1:1.3, the center information signal is expanded by a ratio of 1:1.2, and the surround information signals is expanded by a ratio of 1:1.5. This expansion is the same as that provided in the decoding units of the type shown in FIG. 1, preferably used to decode the signals encoded by the encoder system so that the monitor 64 will detect the signals as they will appear at the output of the respective expanders of the preferred decoding system. The output signals of the encoding system are respectively provided at the output terminals 52A and 52B of the encoding matrix 50A, where they can be fed directly to the recording channel 54 as shown in FIG. 4, or through the two respective compressors 56A and 56B (shown in FIG. 5). The latter, in turn, are applied to the recording channel 54, as shown in FIG. 5.

As constructed, the matrix 22 and the lowpass, bandpass and highpass filters of the expanders 24 provide a feedback path for the encoding signals so as to eliminate or substantially reduce the artifacts which would otherwise be produced by the decoding matrix 22 upon playback. In this way the recording medium is provided with the two encoded signals which have been processed so that artifacts produced during the decoding process will be minimized.

In FIG. 5, the compressors 56 provide additional compression to the encoded signals. The encoded signals are expanded in a complementary manner by the expanders 58 when decoding. The use of compressors 56, in addition to the compressors 62, has a multiplicative effect on the total compression of the signals prior to recording. Specifically, although the compressors 56 are used to compress the encoded signals it has the effect, when combined with the effect of the compressors 62, of compressing the left and right information signals by a ratio of 1.95:1, the center information signal by a ratio of 1.8:1 and the surround information signal by a ratio of 2.25:1. This provides the needed compression for recording the audio signals on such medium as 16 mm film. The combined expansion provided by the expanders 24 and 58 will be the complement of these compression ratios upon playback.

In FIG. 6, the compressor 62 is preferably of the type in which an expander 90 is placed in the feedback path of an operational amplifier 100. In accordance with the present invention, the gain-bandwidth product of the operational amplifier 100 is modified to be the inverse of the gain control unit used in the high-band portion of the expander 90. The overall closed loop frequency response of the circuit in FIG. 6 is, therefore, nearly constant in the high frequency band. When this is so, the loop stability problem at the lower frequency bands is minimized.

As shown in FIG. 6, the output of the decode matrix 22 is applied to the input of the control unit 24 in the form of a three band expander as described in our U.S. Pat. No. 4,589,129. Generally, the expander includes the lowpass, bandpass and highpass filters 80a, 80b and 80c, respectively, for providing the lowband, midband and highband portions of the corresponding signal received from the decoding matrix. The outputs of the filters are applied to the the inputs of level sensors 82a, 82b and 82c, which in turn have their respective outputs connected to the control inputs of gain control units 84a, 84b and 84c. The latter have their inputs connected to respectively receive the outputs of the filters 80, and their respective outputs connected through the summing amplifier 86 to the monitor 64.

Expander 90, substantially identical to the expander 24, is also utilized, wherein the expander 90 is connected in a feedback loop with the operational amplifier 100 so as to form the compressor unit 62. The expander 90 is identical to the expander 24. The output of the lowpass, bandpass and highpass filters 80a, 80b and 80c of the expander 24 are also connected to the respective inputs of the level sensor 82d, 82e and 82f of expander 90, so that the inputs to sensors 82d, 82e and 82f and gain control units 84d, 84e and 84f include both the outputs of the respective filters 80a, 80b and 80c and filters 80d, 80e and 80f. The input 102 terminal of the compressor unit 62 receives the signal from the corresponding terminal 48. Input terminal 102 is connected through the resistor 104 to the junction 106. Junction 106 is also connected through resistor 108 to the output of the expander 90 so as to receive a feedback signal therefrom. Junction 106 is also connected to the input of gain control unit 110, which in turn has an output connected to the inverting input of the operational amplifier 100, the non-inverting input of the latter being connected to system ground. The operational amplifier 100 has a resistor 112 and capacitor 114 connected in series with one another and in a feedback loop between the output and inverting input of the amplifier.

The output of the amplifier 100 is connected to the output 116 of the compressor unit, which in turn, as shown in FIGS. 4 and 5, is connected to the input of the encoding matrix 50A. The output of the operational amplifier 100 is connected through resistor 118 to the input of an inverting amplifier 120. Inverting amplifier 120 includes a feedback resistor 122 and a feedback capacitor 124. The output of inverting amplifier 116 is applied to the input 126 of the expander 90 so as to complete that feedback loop. The output of the amplifier 100 is also connected through resistor 128 to the inverting amplifier 130 having a feedback capacitor 132. The output of amplifier 130 is connected through resistor 134 to the junction 106 so as to provide DC stability in the loop formed by the operational amplifier 100 and the expander 90.

The gain control unit 110 is set for compression and has its control input connected to receive the output signal from the high frequency level sensor 82f so that the latter controls the gain of the unit, as well as the stability of the loop. In operation, the expander 90 in the feedback loop of the operational amplifier 100 will produce a variable gain-bandwidth product which exactly complements the expander 24, while maintaining stability under all gain settings possible in the operation of the expander 24.

The feedback technique described in FIG. 6 in which the gain control unit 110 is disposed at the input of the amplifier 100 and the expander 90 disposed in the feedback path of the amplifier can also be used for signal expansion. In such a case, the expander 90 is replaced with a compressor, preferably of the multi-band type. The gain control unit 110 will, however, be set for signal expansion. Further, the technique of using the gain control unit 110 at the input of the amplifier 100 can be employed in any circuit in which there are gain changing devices disposed in the feedback loop whether the end circuit is used for compression or expansion of substantially the entire input signal, or compression or expansion of a portion of the input signal, as, for example, in adaptive filters, such as described in U.S. Pat. No. 4,101,849, issued to David E. Blackmer et al., on July 18, 1978, or any other type of device utilizing a compressor or expander in a feedback loop around an operational amplifier.

Figure 7:
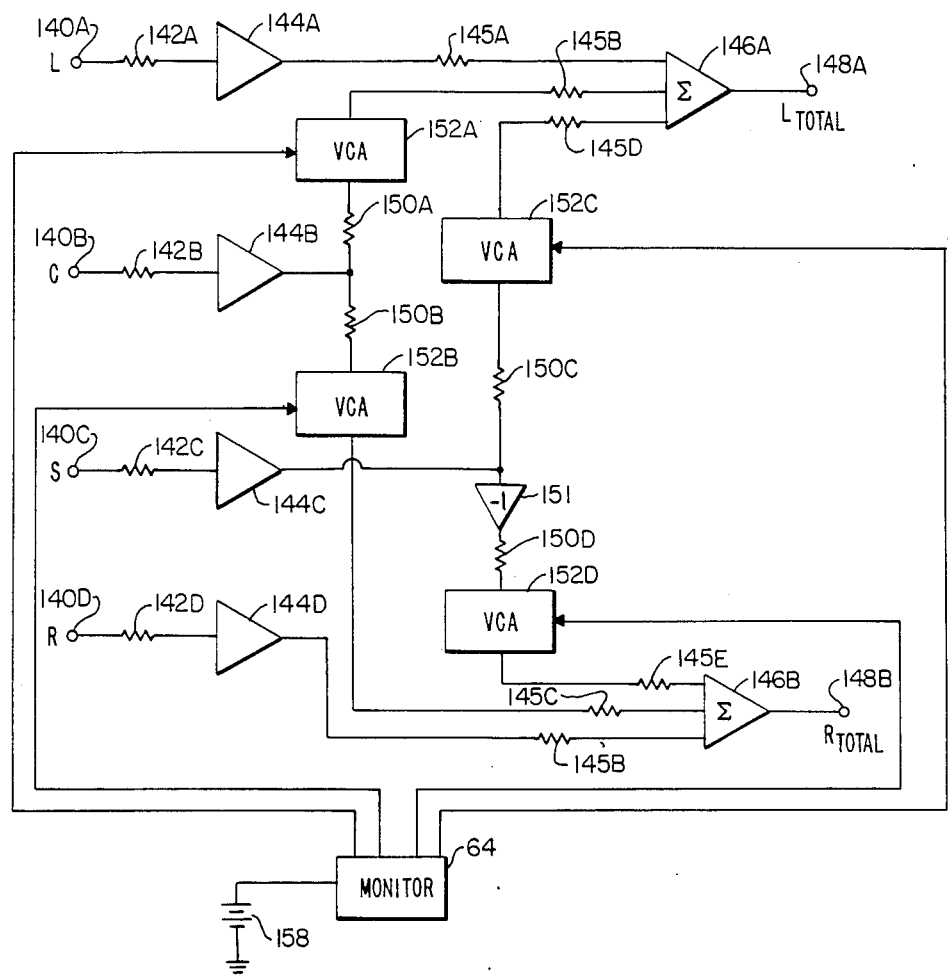
FIG. 7 is a schematic illustration of the preferred encoding matrix utilized in the encoding system of the present invention.

As shown in FIG. 7, the encoding circuit includes the input terminals 140A, 140B, 140C and 140D for receiving the respective left, center, surround and right information signals. The input terminals are connected through the respective resistors 142A, 142B, 142C, and 142D to the corresponding buffers 144A, 144B, 144C and 144D. Buffers 144A and 144D have their respective outputs connected through respective resistors 145A and 145F to the corresponding inputs of summing amplifiers 146A and 146B. The output of amplifiers 146A and 146B are respectively connected to terminals 148A and 148B for providing the $L_T$ and $R_T$ encoded signals, respectively. Buffer 144B has its output connected through the resistors 150A and 150B to the signal inputs of VCAs 152A and 152B. Buffer 144C has its output connected through the resistor 150C to the signal input of VCA 152C and through signal inverter 151, through resistor 150D to the signal input of VCA 152D. The outputs of VCAs 152A and 152C are connected through resistors 145B and 145D to an input of the summing amplifier 146A. The outputs of VCAs 152B and 152D are connected through resistors 145C and 145E to the summing amplifier 146B. VCAs 152A, 152B, 152C and 152D are preferably for setting the gain of the signal and selectively controlled by controls on the monitor 64.

The control monitors 64 are suitably connected to a source of DC voltage 158 and provide a control of the amount of relative weighting of the center and surround signals provided to each encoded signal so as to improve channel separation. This is preferred, since the listener 12 will be more influenced by the directionality provided by the surround speakers 10D, 10E and 10F that are provided by speakers 10A, 10B and 10C. Further, by using the controls the operator monitoring the signals can simulate panning wherein a signal which is present on the center or surround input, can be made to appear to emanate from one side, wherein one pair of VCAs 152A and 152C or 152B and 152D are set to provide maximum transmission while the other two provide minimum transmission. As the operator increases the DC control signals to one set of VCAs while decreasing the other set, the actual sound when reproduced will appear to pan from one side to the other. Obviously, one pair of VCAs 152A, 152B or 152C, 152D can be omitted where control is desired in only one of the channels.

The foregoing encoding system provides greater separation among the information signals upon reproduction of the information signals because of the different compression and expansion factors used for each information signal in the FIG. 4 embodiment and for each information and encoded signal in the FIG. 5 embodiment. By using the decoding matrix 22 in the feedback path of the compressor during the encoding process, the artifacts generated in the decoder will be substantially eliminated from the output signals from the expanders 24. The encoded signals provided to the recording channel in both FIGS. 4 and 5 will be provided with a greater S/N at greater compression ratios so that the encoding system can easily be used to process such noisy signals as audio signals generated with 16 mm film. Finally, by providing the VCAs 152 in the encoding matrix in FIG. 7, the front and/or rear surround signals can be selectively weighted so as to effect the left-right directionality of the virtual image on playback.

In addition, several advantages are achieved by the gain control techniques embodied in the compressor shown in FIG. 6. In particular, relatively high compression ratios can easily be produced using complementary expansion. The compressor of the type including the expander 90 connected in a feedback loop of operational amplifier 100 provides signal compression at relatively large gain changes, without oscillation due to excess phase shift at high frequencies when the expander gain is high or loss of high frequency response when the expander gain is low. Such a compressor provides signal compression which will not cut off the high frequency spectral portions of the information signal compressed at relatively large gain settings.

Since certain changes may be made in the above apparatus without departing from the scope of the invention herein involved, it is intended that all matter contained in the above description or shown in the accompanying drawings shall be interpreted in an illustrative and not in a limiting sense.

What is claimed is:

1. A signal encoding system for generating at least two encoded signals in response to a plurality of information signals containing audio data representative of at least one virtual image so that said encoded signals can be subsequently decoded by a decoding system, including decoding matrix means for decoding said encoded signals, so as to regenerate said information signals, said signal encoding system comprising:

signal encoding means for generating said encoded signals in response to said information signals, said signal encoding means including means for impressing a signal gain on each of said information signals as a function of and in response to a corresponding control signal; and means for sensing at least a portion of the signal level of each said information signal and for generating the corresponding control signal in response to the respective information signal; and a substantial duplicate of said decoding matrix means coupled to said signal encoding means for generating a feedback signal corresponding to each of said information signals;

wherein said encoding signals are modified in response to said feedback signals so as to reduce the noise artifacts generated by said decoding matrix when said encoded signals are decoded by said decoding system.

2. A system according to claim 1, wherein said means for sensing at least a portion of the signal level of each said information signal and for generating the corresponding control signal includes means for sensing at least a portion of the corresponding signal level of each of said feedback signals and means for generating said corresponding control signal in response to and as a function of both said information signal and said feedback signal.

3. A system according to claim 2, wherein said means for impressing a signal gain on each of said information signals is a signal compressor.

4. A system according to claim 3, wherein each of said signal compressors is set to weight each of said information signals according to a predetermined compression ratio.

5. A system according to claim 4, wherein said plurality of information signals respectively represent components of said virtual image at a predetermined position relative to the front, rear, right and left of a listener when the encoded signals are decoded by said decoding matrix so as to regenerate said information signals, which in turn are used to correspondingly drive loudspeakers located approximately at the front, rear, right and left positions relative to the listener, and the compressor for compressing said information signal for driving the loudspeaker located approximately at the rear position provides a greater compression ratio than the compressor for compressing said information signal for driving the loudspeaker located approximately at the front position, and the compressors for compressing each of the information signals for driving the loudspeakers located approximately at the left and right positions each provides a greater compression ratio than the compressor for compressing said information signal for driving the loudspeaker located approximately at the front position and a smaller compression ratio than the compressor for compressing said information signal for driving the loudspeaker located approximately at the rear position.

6. A system according to claim 3, wherein each said compressor is a multi-band compressor.

7. A system according to claim 6, wherein each said multi-band compressor includes filter means for separating the corresponding information signal into a plurality of signal components corresponding to a plurality of frequency bands, means for separately compressing each of said components so as to generate a plurality of compressed signal components, and means for combining said compressed signal components; and said decoding matrix means includes second filter means for separating each of said feedback signals into a plurality of signal components corresponding to said plurality of frequency bands so as to generate a plurality of feedback signal components for each of said feedback signals, wherein said means for separately compressing each of said components is responsive to a corresponding one of said feedback components.

8. A signal encoding system for generating at least two encoded signals in response to a plurality of information signals containing audio data representative of at least one virtual image so that said encoded signals can be subsequently decoded by a decoding system, including decoding matrix means for decoding said encoded signals, so as to regenerate said information signals, and the information signals in turn can be used to correspondingly drive loudspeakers located at various positions relative to the listener so as to recreate the virtual image relative to the listener, said signal encoding system comprising:
    signal encoding means for generating said encoded signals in response to said information signals; and
    a substantial duplicate of said decoding matrix means coupled to said signal encoding means for generating a feedback signal corresponding to each of said information signals;
    wherein said encoding signals are modified in response to said feedback signals so as to reduce the noise artifacts generated by said decoding matrix when said encoded signals are decoded by said decoding system, said encoding means comprises means for selectively weighting said information signal representative of the information to the rear of the listener so as to affect the left-right directionality of said virtual image.

9. A signal encoding system for generating at least two encoded signals in response to a plurality of information signals containing audio data representative of at least one virtual image so that said encoded signals can be subsequently decoded by a decoding system, including decoding matrix means for decoding said encoded signals, so as to regenerate said information signals, and the information signals in turn can be used to correspondingly drive loudspeakers located at various positions relative to the listener so as to recreate the virtual image relative to the listener, said signal encoding system comprising:
    signal encoding means for generating said encoded signals in response to said information signals; and
    a substantial duplicate of said decoding matrix means coupled to said signal encoding means for generating a feedback signal corresponding to each of said information signals;
    wherein said encoding signals are modified in response to said feedback signals so as to reduce the noise artifacts generated by said decoding matrix when said encoded signals are decoded by said decoding system, and said encoding means comprises means for selectively weighting said information signal representative of the information to the front of the listener so as to affect the left-right directionality of said virtual image.

10. A signal encoding system for generating at least two encoded signals in response to a plurality of information signals containing audio data representative of at least one virtual image so that said encoded signals can be subsequently decoded by a decoding system, including decoding matrix means for decoding said encoded signals, so as to regenerate said information signals, said signal encoding system comprising:
    signal encoding means for generating said encoded signals in response to said information signals;
    means for compressing each of said encoded signals; and
    a substantial duplicate of said decoding matrix means coupled to said signal encoding means for generating a feedback signal corresponding to each of said information signals;
    wherein each of said encoding signals is modified in response to the corresponding one of said feedback signals so as to reduce the noise artifacts generated by said decoding matrix when said encoded signals are decoded by said decoding system.

11. A system for modifying the signal gain impressed on at least a portion of an input signal so as to modify the dynamic range of at least the portion of said input signal, said system being of the type including operational amplification means including (a) input means for receiving said input signal, (b) output means for providing an output signal at said output means in response to said input signal, and (c) a signal path disposed between the input means and output means of said operational amplification means for transmitting a first signal along said signal path, wherein the signal path includes means for impressing a gain on at least a portion of said first signal in response to and as a function of a first control signal, and means for generating said control signal in response to and as a function of said first signal, wherein the improvement comprises:
    means, responsive to said input signal and said first signal, for further modifying the signal gain impressed on said portions of said input and first signals in response to a second control signal; and
    means for generating said second control signal in response to at least a portion of said first signal.

12. A system according to claim 11, wherein said signal path further includes filter means for separating said first signal into a plurality of signal components including a high frequency component, and means responsive to each of said signal components for impressing a gain on each of said signal components in response to and as a function of a corresponding control signal so as to generate a like plurality of modified signal components, means for generating each of said control signals in response to and as a function of the corresponding signal component and means for combining said plurality of modified signal components for generating said first signal, and wherein said means for generating said second control signal is responsive to the high frequency modified signal component.

13. A system according to claim 12, wherein said system is a compressor, said first signal is a feedback signal responsive to said output signal, and said means for impressing a gain on at least a portion of said first signal is a multi-band expander.

14. A system according to claim 13, wherein said means for further modifying the gain impressed on said input and first signals is a voltage controlled amplifier having a gain as a function of the high frequency modified signal component.

* * * * *

UNITED STATES PATENT AND TRADEMARK OFFICE
CERTIFICATE OF CORRECTION

PATENT NO. : 4,680,796
DATED : July 14, 1987
INVENTOR(S) : David E. Blackmer, James H. Townsend, Jr.

It is certified that error appears in the above-identified patent and that said Letters Patent is hereby corrected as shown below:

Claim 14, column 14, line 64, delete "mcans" and substitute therefor -- means --.

Signed and Sealed this

Fifteenth Day of March, 1988

Attest:

DONALD J. QUIGG

*Attesting Officer*    *Commissioner of Patents and Trademarks*